United States Patent
Oh et al.

(10) Patent No.: US 9,748,934 B1
(45) Date of Patent: Aug. 29, 2017

(54) SYSTEMS AND METHODS FOR REDUCING POWER SUPPLY NOISE OR JITTER

(71) Applicant: ALTERA CORPORATION, San Jose, CA (US)

(72) Inventors: Kyung Suk Oh, Cupertino, CA (US); Yujeong Shim, Santa Clara, CA (US); Yanjing Ke, Union City, CA (US); Tim Tri Hoang, San Jose, CA (US); Hae-Chang Lee, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/616,406

(22) Filed: Feb. 6, 2015

(51) Int. Cl.
*H03M 9/00* (2006.01)
*H03K 3/013* (2006.01)

(52) U.S. Cl.
CPC .............. *H03K 3/013* (2013.01); *H03M 9/00* (2013.01)

(58) Field of Classification Search
CPC ........ H03K 3/013; H03K 3/015; H03K 3/011; H03M 9/00
See application file for complete search history.

(56) References Cited

U.S. PATENT DOCUMENTS

| 6,781,355 | B2 * | 8/2004 | Gauthier | H02J 1/02 323/233 |
| 7,119,607 | B2 * | 10/2006 | Huang | G06F 1/26 327/256 |
| 8,836,384 | B1 | 9/2014 | Oh et al. | |

* cited by examiner

*Primary Examiner* — Jung Kim
(74) *Attorney, Agent, or Firm* — Fletcher Yoder P.C.

(57) ABSTRACT

Systems and methods for reducing jitter due to power supply noise in an integrated circuit by drawing additional current. The additional current causes the total current to generally have a frequency higher than a resonant frequency of the integrated circuit and/or a power distribution network of the integrated circuit. A power distribution network may supply power to components of an integrated circuit, and data driver circuitry may draw first current to drive a serial data signal generated from a parallel data signal. Compensation circuitry may receive the parallel data signal and draw second current at times when the compensation circuitry determines data driver circuitry is not drawing the first current based on the parallel data signal, thereby causing a net of the first and second current to be higher than a resonant frequency range of the integrated circuit device and/or a component of the integrated circuit device.

19 Claims, 9 Drawing Sheets

SYSTEMS AND METHODS FOR REDUCING POWER SUPPLY NOISE OR JITTER

BACKGROUND

This disclosure relates to reducing power supply noise and/or jitter in an integrated circuit device by drawing additional current to increase the total current frequency above a resonant frequency range of the power supply network or the integrated circuit device.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Modern electronic devices, such as computers, portable phones, digital cameras, and televisions, often use integrated circuits to process and transmit data. Processing and transmitting data uses power, which may be provided to the components of an integrated circuit by a power distribution network inside the integrated circuit. Different components draw different amounts and frequencies of current from the power distribution network. Some components, such as a transmitter, may draw significant amounts of current from the power distribution network to transmit a data signal, specifically drawing a current each time the polarity of the data signal switches from low to high or from high to low. When this occurs, power supply noise from the power distribution network could cause "jitter" in the data signal. Too much jitter may cause the data signal to become unintelligible. As modern electronic devices continue to use higher data transfer rates, jitter may have an increasingly outsized effect on the transmitted data signals.

Integrated circuit designs have accounted for jitter by adding capacitance to the power distribution network of the integrated circuit. The power supply noise that causes jitter may be reduced by increasing the amount of on-die decoupling capacitance in the power distribution network and/or by adding capacitance to the package on which the integrated circuit is installed. Adding additional capacitance, however, takes up valuable die space and that could otherwise contain more productive circuitry. With increasing data rates, however, obtaining a satisfactory data signal may involve adding increasingly large amounts of on-die capacitance.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

This disclosure relates to systems and methods for reducing jitter due to power supply noise in an integrated circuit (IC) by drawing additional current. The additional current may cause a total amount of current, also referred to as a net current, to have a frequency higher than a resonant frequency of the IC or the power distribution network (PDN) of the IC. In one example, such an IC device may include a PDN, data driver circuitry, and compensation circuitry. The power distribution network may supply power to components of the IC device and the data driver circuitry may draw a first current from the PDN to drive a data signal. Compensation circuitry may draw a second current from the power distribution network at times when the data driver circuitry is not drawing the first current, thereby causing a combination of the first and second current to be substantially outside a range of resonant frequencies of the integrated circuit device and/or a component of the integrated circuit device (e.g., the PDN). Additionally, the compensation circuitry may draw the second current based on receiving a parallel data signal used for drawing the first current from the PDN.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
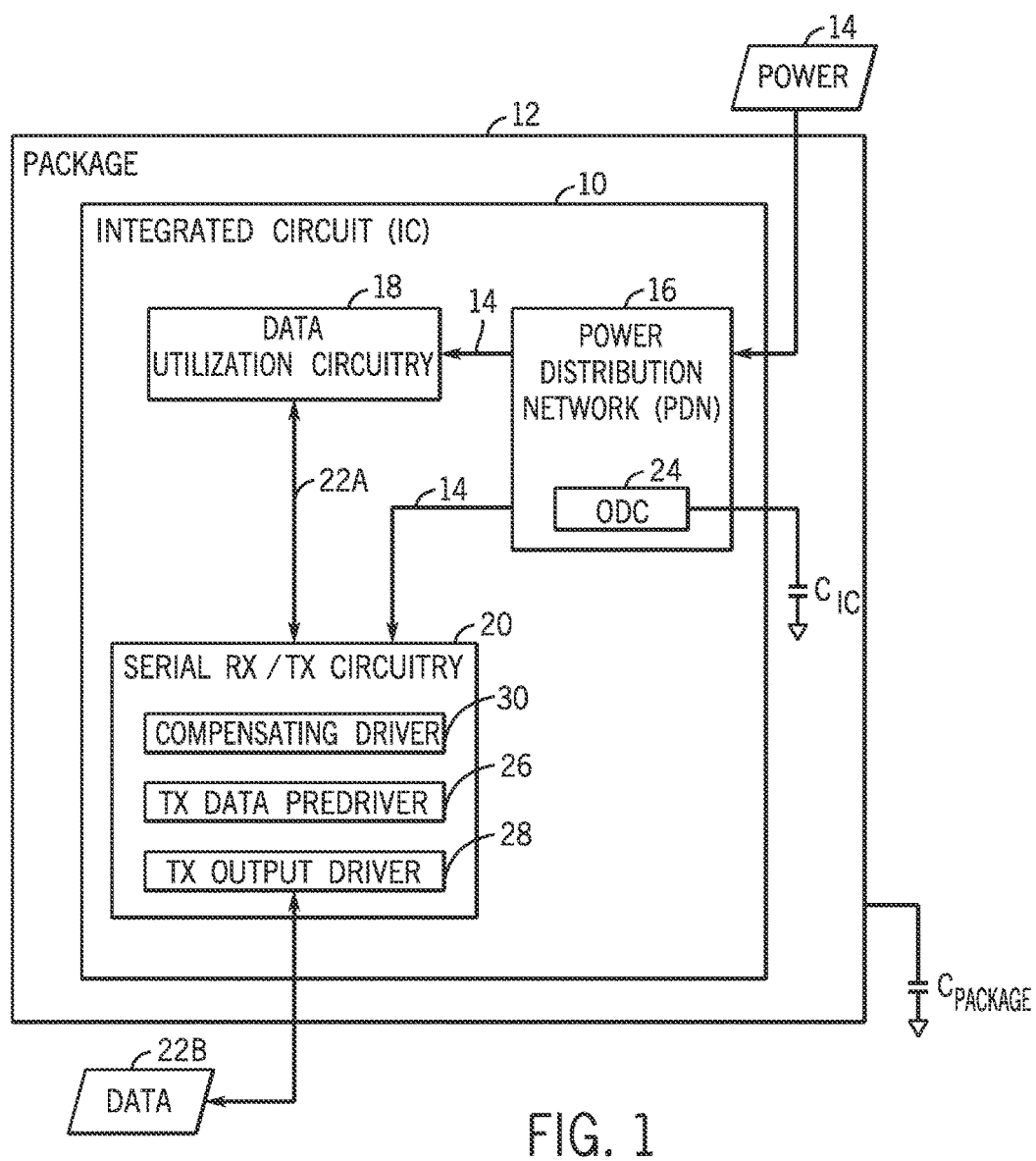
FIG. 1 is a block diagram of an integrated circuit that uses a compensating driver to reduce jitter caused by power supply noise from a power distribution network, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of this disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of this disclosure are not intended to be interpreted as excluding the existence of additional embodiments that also incorporate the recited features.

This disclosure relates to reducing power supply noise that can produce jitter in data transmission signals. In particular, integrated circuits may generate data transmission signals using components that draw power from internal power distribution networks. Certain components of the integrated circuit, such as transmitter circuitry of a transceiver, may draw relatively large quantities of current from such a power distribution network when generating a data transmission signal. Any noise that results may cause jitter in the data transmission signal.

In operation, the transmitter circuitry may receive an input data signal (e.g., a parallel data signal used internally to the integrated circuit) and may output a data transmission signal (e.g., a serial signal that can be output from the integrated circuit to other devices). Each time the data transmission signal switches from logic low to logic high (i.e., 0 to 1) or from logic high to logic low (i.e., 1 to 0), the transmitter circuitry may draw a current from the power distribution network. Power supply noise appearing in this current could cause the data transmission signal to "jitter." The power supply noise may be understood to be slight variations in how the power distribution network provides each amount of current (e.g., faster or slower or with greater or lesser magnitude). As such, in this disclosure, "jitter" refers to variable shifts forward or backward in time of the data transmission signal from expected unit interval (UI) data sampling locations. In effect, too much jitter could cause the output data transmission signal to become unintelligible. This may be increasingly the case as transmitter circuitry is designed to produce faster and faster data transmission signals (and accordingly closer UI data sampling locations), since the magnitude of the jitter due to power supply noise may remain generally the same. This jitter is also referred to in this disclosure as "jitter due to power supply noise" or "power-supply-noise-induced jitter."

It is believed that the power supply noise that causes jitter is a function of the frequency and magnitude of the current that is drawn. Specifically, when the current that is drawn occurs in a resonant frequency range of the power distribution network, a relatively larger impedance of the power distribution network may cause an increase in power supply noise and, accordingly, increased jitter. To prevent or reduce jitter, compensation circuitry may generate a dummy signal that draws current that is at least partly complementary to the current drawn by the driver circuitry of the transmitter circuitry (e.g., as described in U.S. Pat. No. 8,836,384, issued on Sep. 16, 2014, the disclosure of which is hereby incorporated by reference in its entirety for all purposes). The additional current drawn by the compensation circuitry, when added to the current drawn by the transmitter circuitry, may cause the total frequency of the current drawn to be higher than the resonant frequency range of the power distribution network. This may result in lower power supply noise and, accordingly, reduced jitter.

Additionally, because the compensation circuitry uses feedback of the dummy signal to generate a subsequent dummy signal, high speed data transmission may result in timing issues for the compensation circuitry to generate the dummy signals. For example, at some data transmission speeds, a feedback path of the dummy signal to generate the subsequent dummy signal may take slightly more time than what is available, which limit jitter reduction by the compensation circuitry. Accordingly, in the present disclosure, the serialization architecture may generate the dummy signals beginning at a half-rate implementation. That is, parallel data signals used to create the dummy signals may originate from the parallel data signals prior to reaching a 2:1 multiplexer for serialization of the parallel data signals. In this manner, the compensation circuitry may have additional time to generate dummy signals based on the feedback paths within the compensation circuitry prior to transmission.

As noted above, the compensation circuitry may draw current that is at least partially complementary to the current drawn by the transmitter circuitry. In this disclosure, the phrase "at least partially complementary" is used to clarify that the additional current may not necessarily be drawn in a fully complementary fashion (e.g., occurring at precisely the same magnitude and every rising and/or falling clock edge that the transmitter current is not drawn). Although fully complementary current may provide a greater reduction in jitter, drawing fully complementary current may consume more power. Instead, in some embodiments, the compensating driver may draw current that is only partially complementary. In one example, the compensating driver may draw current with a lower magnitude than that drawn by the transmitter. In a second example, the compensating driver may draw current at only some of the rising and/or falling clock edges that occur when the transmitter current is not being drawn. In a third example, the compensating driver may draw current not precisely on—but rather some time slightly before or after—the rising and/or falling clock edge during which the transmitter current is not drawn. In each of these three examples of partially complementary current, the total current being drawn that occurs in the resonant frequency range may be reduced, thereby reducing jitter on the integrated circuit.

One example of an integrated circuit 10 having reduced jitter appears in FIG. 1. The integrated circuit 10 may be installed on a package 12. Power 14 from an external source may be distributed over the integrated circuit 10 by a power distribution network (PDN) 16. In the example of FIG. 1, the power distribution network (PDN) 16 supplies the power 14 to data utilization circuitry 18 and serial receiver/transmitter (RX/TX) circuitry 20. These components are provided by way of example, and it should be understood that other components of the integrated circuit may be present and receive power from the power distribution network (PDN) 16.

The data utilization circuitry 18 may represent any suitable circuitry that may operate on data (e.g., parallel data 22A). The data utilization circuitry 18 may receive and/or provide data (e.g., the parallel data 22A) to the serial RX/TX circuitry 20. The serial RX/TX circuitry 20 may communicate the data (e.g., the parallel data 22A) out of the integrated circuit 10 and package 12 (e.g., as serial data 22B). The serial RX/TX circuitry 20 may also receive other data (e.g., serial data 22B) from elsewhere and provide corresponding parallel data 22A to the data utilization circuitry 18. The data utilization circuitry 18 may include, for example, programmable logic such as a field programmable gate array (FPGA) fabric. As such, the integrated circuit 10 may represent a programmable logic device (PLD), such as those available by Altera Corporation of San Jose, Calif. In other examples, the data utilization circuitry 18 may represent application specific integrated circuit (ASIC) circuitry. The data utilization circuitry 18 may also represent data processing circuitry of a graphics processing unit (GPU) or a central processing unit (CPU).

The natural inductance of the integrated circuit (IC) 10 and the package 12 may cause some power supply noise when the power distribution network (PDN) 16 provides current to the data utilization circuitry 18 and/or the serial RX/TX circuitry 20. To offset some of the natural inductance of the package 12, a package capacitance ($C_{PACKAGE}$) may be added by increasing the number of layers of the package 12 and/or by installing on-package decoupling capacitors. In addition, to reduce the inductance of the integrated circuit 10 and/or power distribution network (PDN) 16, an on-die capacitance (ODC) 24 may be formed within the integrated circuit (IC) 10 to add an additional integrated circuit capacitance $C_{IC}$.

These additional capacitances, however, may add cost and/or take up valuable die space on the integrated circuit (IC) 10. As such, in some embodiments, the package capacitance ($C_{PACKAGE}$) and the on-die capacitance (ODC) 24 $C_{IC}$ may be substantially reduced compared to devices without the benefit of this disclosure. Indeed, in some embodiments, no additional package capacitance ($C_{PACKAGE}$) may be installed. Moreover, in some embodiments, the on-die capacitance (ODC) 24 may be less than 5.3 nanoFarads per square millimeter (nF/mm$^2$) of the integrated circuit (IC) 10. By reducing the amount of on-die capacitance (ODC) 24, additional area of the integrated circuit (IC) 10 may be used by more productive circuitry.

The amount of the package capacitance ($C_{PACKAGE}$) and on-die capacitance (ODC) 24 can be reduced, according to the present disclosure, because jitter due to power supply noise is reduced through interactions between TX data pre-driver circuitry 26, a TX output driver 28, and compensation circuitry 30. As shown in FIG. 1, the serial RX/TX circuitry 20 may include the TX data pre-driver circuitry 26 and the TX output driver 28 to amplify a data signal (e.g., to amplify a serialized version of the parallel data 22A) transmitted out of the integrated circuit (IC) 10 as the serial data 22A. In some embodiments, similar circuitry may be used to transmit data (e.g., the serial data 22A) to remote locations on the integrated circuit (IC) 10. In the example of FIG. 1, the TX data pre-driver circuitry 26 may draw current from the power distribution network (PDN) 16 at various frequencies depending on the frequency of the serial data 22A that is being amplified by the TX data pre-driver circuitry 26. The compensation circuitry 30 may generate a dummy signal that draws current that are at least partly complimentarily to the current drawn by the serial RX/TX circuitry 20. As will be discussed below, the sum of the current drawn by the TX data pre-driver circuitry 26 and the compensation circuitry 30, also referred to as the net current, may generally have a total, net frequency higher than a resonant frequency range of the integrated circuit (IC) 10 and/or power distribution network (PDN) 16. As a result, power supply noise and power-supply-induced jitter may be reduced.

Figure 2:
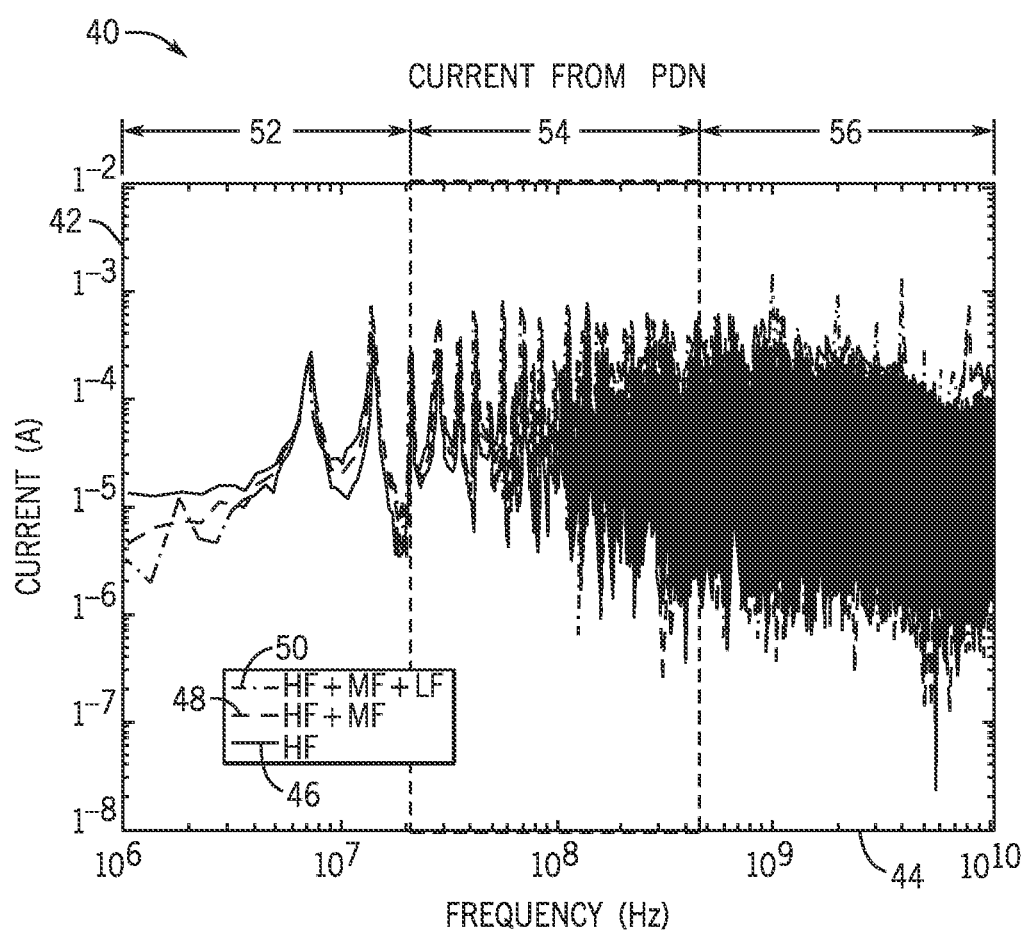
FIG. 2 is a plot of amounts and frequencies of current drawn from the power distribution network, in accordance with an embodiment.
Figure 3:
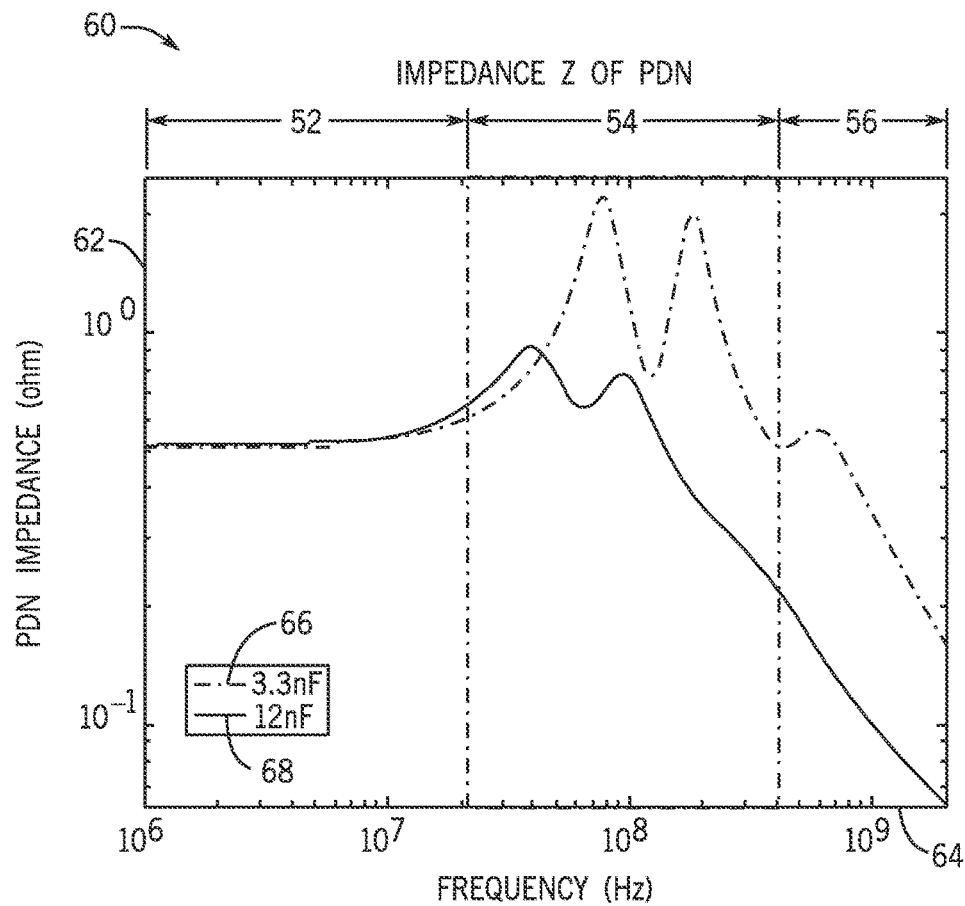
FIG. 3 is a plot of impedance of the power distribution network as a function of current frequency, in accordance with an embodiment.

FIGS. 2 and 3 illustrate a relationship between current frequency and an impedance of the power distribution network (PDN) 16. Power noise is, in general, a function of the current and PDN impedance. As seen in FIG. 2, a plot 40 relates current magnitude in units of amperes (A) (ordinate 42) to current frequency in units of Hertz (Hz) (abscissa 44) of current drawn by the TX data pre-driver circuitry 26 and/or a serializer of the serial RX/TX circuitry 20, but not the compensation circuitry 30. The scales of the ordinate and abscissa are logarithmic. The plot 40 simulates the effect of transmitting pseudorandom binary sequence 15 (PRBS15) signals, which represent a type of data signal that may be handled by integrated circuit (IC) 10. A legend appearing in FIG. 2 includes the terms "HF" (high frequency), "MF" (medium frequency), and "LF" (low frequency). These terms refer to various stages of a serializer of the serial RX/TX circuitry 20. Specifically, such a serializer may have three stages, low frequency (LF) (e.g., a 64:8 or 80:8 multiplexer), medium frequency (MF) (e.g., a 8:2 multiplexer), and high frequency (HF) (e.g., a 2:1 multiplexer). Each serializer stage can draw different amounts of power.

The plot 40 of FIG. 2 shows the current spectrum of a different power connection for each stage of a serializer of the serial RX/TX circuitry 20. Thus, "HF" means that the higher frequency multiplexer may draw a separate current value. Similarly, "LF+MF+HF" means that all serializer components may draw the same current values. As such, a solid line 46 represents a separate current drawn by an HF (high frequency) component of the serial RX/TX circuitry 20 (e.g., a higher frequency multiplexer of a serializer of the serial RX/TX circuitry 20) for a PRBS15 signal of, for example, approximately 32 Gbps, which may be one of many data transfer frequencies that certain embodiments of this disclosure may employ. A dashed line 48 represents current drawn when both an HF (high frequency) component and an MF (medium frequency) component of the serial RX/TX circuitry 20 (e.g., high frequency and medium frequency multiplexers of a serializer of the serial RX/TX circuitry 20) draw common amounts of current. A dashed-dotted line 50 represents current drawn when an HF (high frequency) component, an MF (medium frequency) component, and an LF (low frequency) component of the serial RX/TX circuitry 20 (e.g., high frequency, medium frequency, and low frequency multiplexers of a serializer of the serial RX/TX circuitry 20) draw common amounts of current.

The plot 40 is divided into frequency ranges 52, 54, and 56. As will be discussed below, the frequency range 54 represents a resonant frequency range of the power distribution network (PDN) 16 of the integrated circuitry (IC) 10 (e.g., 10-400 MHz). The frequency ranges 52 and 56 respectively represent frequency ranges below and above the resonant frequency range 54. As seen in the plot 40 of FIG. 2, a significant amount of the current that is drawn occurs in the resonant frequency range 54. For reasons discussed below, the resonant frequency range 54 may be understood to be associated with power supply noise and, accordingly, power-supply-noise-induced jitter.

Indeed, large amounts of current occurring in the resonant frequency range 54 may be problematic. Specifically, the impedance of the power distribution network (PDN) 16 may be greatest in the resonant frequency range 54. This is shown in a plot 60 of FIG. 3, which illustrates the dependence of impedance Z of the power distribution network (PDN) 16 on the frequency of current being drawn from the power distribution network (PDN) 16. In the plot 60, an ordinate 62 represents the impedance in units of Ohms (Ω) on a logarithmic scale and an abscissa 64 illustrates current frequency in hertz (Hz) on a logarithmic scale. The frequency ranges 52, 54, and 56 are the same as those shown in the plot 40 of FIG. 2.

As can be seen in the plot 60 of FIG. 3, an impedance of the power distribution network (PDN) 16 is greatest in the resonant frequency range 54. A dashed line 66 shows the impedance of the power distribution network (PDN) 16 when an additional 3.3 nF of on-die capacitance (ODC) 24 has been added. A solid line 68 shows the impedance of the power distribution network (PDN) 16 when an additional 12 nF of on-die capacitance (ODC) 24 has been added. As noted above, lower on-die capacitance (ODC) 24 is preferred. Yet when the on-die capacitance (ODC) 24 is 3.3 nF (dashed line 66), the impedance of the power distribution network (PDN) 16 may be quite substantial in the resonant frequency range 54. Even when the on-die capacitance (ODC) 24 is a much higher 12 nF (solid line 68), the impedance is still significant, though lower, in the resonant frequency range 54. Outside the resonant frequency range 54, in the frequency ranges 52 and 56, the impedances are much lower for both amounts of on-die capacitance (ODC) 24.

The amount of jitter relates to power supply noise (ΔV), which may be understood to equal the impedance (Z) of the power distribution network (PDN) 16 multiplied by the current (ΔI) being drawn from the power distribution network (PDN) 16:

$$\Delta V = \Delta I \times Z$$

Figure 4:
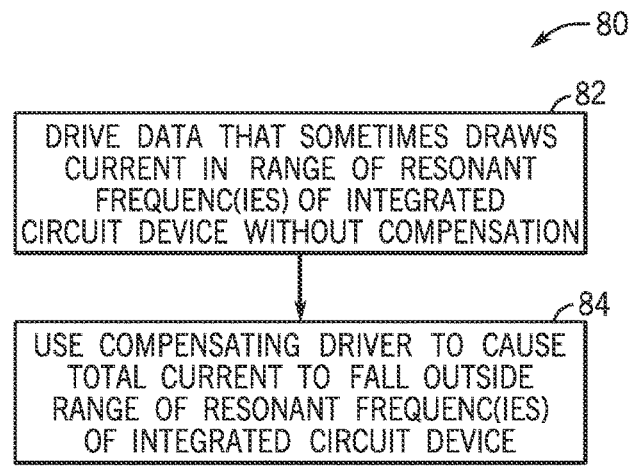
FIG. 4 is a flowchart of a method for reducing jitter due to power supply noise using a compensating driver to draw additional complementary current in accordance with an embodiment.

Since the impedance Z of the power distribution network is believed to depend on the frequency of the current being drawn, when current is drawn in the resonant frequency range 54, as opposed to the frequency ranges 52 and 56, significant amounts of jitter due to power supply noise may result. The compensation circuitry 30, however, may avoid some of the jitter created in this way. As shown by a flowchart 80 of FIG. 4, circuitry of the integrated circuit (IC) 10 may drive data by drawing current from the power distribution network (PDN) 16 that may, without compensation, fall in the range of resonant frequencies 54 (block 82). The data may be driven from, for example, the TX data pre-driver circuitry 26, the TX output driver 28, other components of the serial RX/TX circuitry 20, and/or other circuitry of the integrated circuit (IC) 10.

Without compensation, the current drawn by such data driver circuitry may occur in frequencies in the resonant frequency range 54 (e.g., in the manner illustrated in the plot 40 of FIG. 2). As such, compensating circuitry such as the compensation circuitry 30 shown in FIG. 1 may draw additional current. The additional current may be at least partly complementary to the current drawn by the driver circuitry (block 84). The total current drawn by the data driver circuitry (e.g., the TX data pre-driver circuitry 26, the TX output driver 28, other components of the serial RX/TX circuitry 20, and/or other circuitry of the integrated circuit (IC) 10) and the compensation circuitry (e.g., the compensation circuitry 30 or similar circuitry) thus may have an increased frequency that may be higher than the resonant frequency range 54 (e.g., in the frequency range 56). Recalling the plot 60 of FIG. 3, it may be noted that even with a relatively small amount of on-die capacitance (ODC) 24, the impedance Z of the power distribution network (PDN) 16 may be relatively low in the frequency range 56 beyond the resonant frequency range 54. As such, the total amount of jitter produced by current drawn in the frequency range 56 may be substantially reduced from the amount of jitter that would be produced by current in the resonant frequency range 54.

Figure 5:
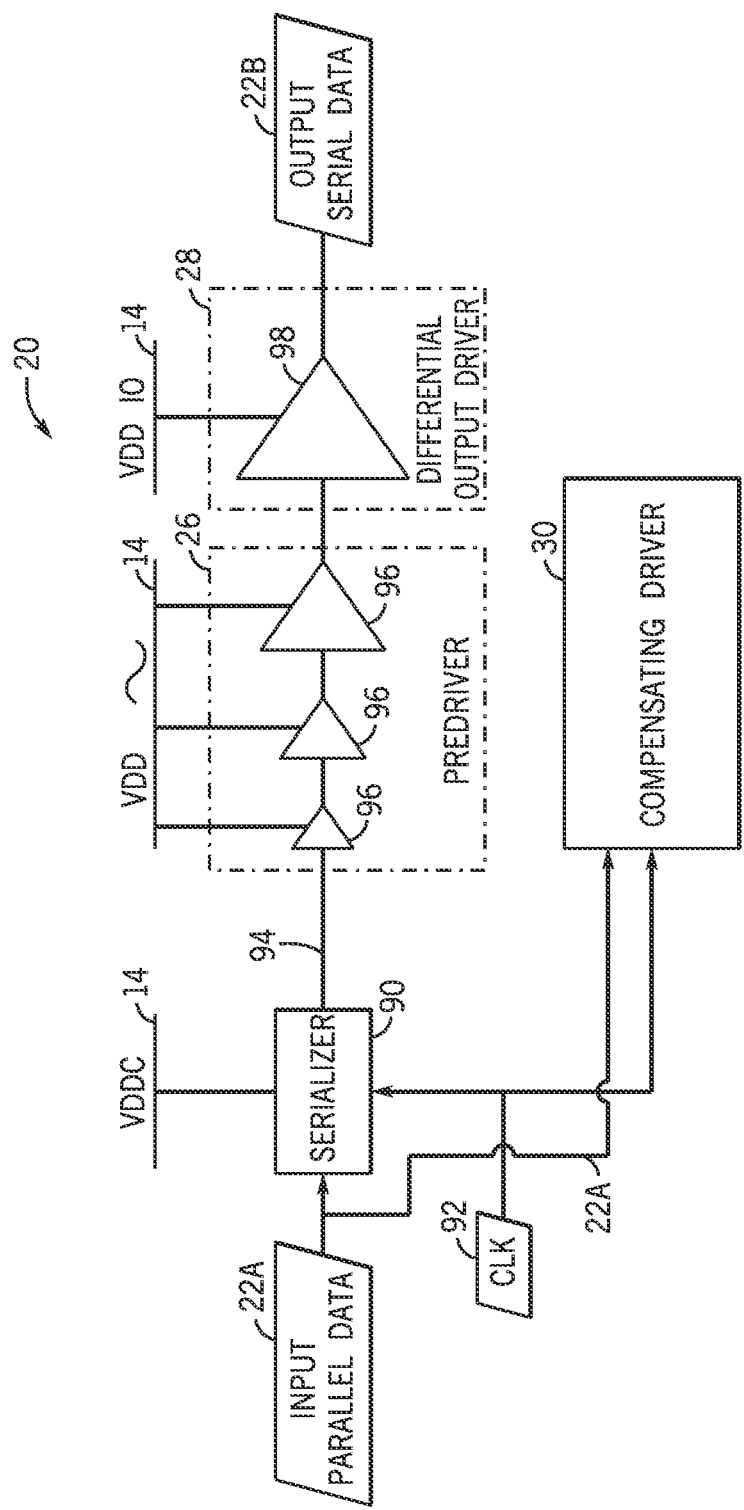
FIG. 5 is a block diagram of a data transmitter and a compensating driver, in accordance with an embodiment.

FIG. 5 provides an example of a block diagram of circuitry that may at least partially make up the serial RX/TX circuitry 20. The circuitry shown in FIG. 5 relates, in particular, to circuitry to receive parallel data 22A and output serial data 22B. Serializer circuitry 90 may receive the input parallel data 22A and a clock signal 92. The serializer circuitry 90 may serialize the parallel data 22A based on the clock signal 92, generating serialized intermediate data 94. The pre-driver circuitry 26 may include multiple amplifier stages 96 that successively amplify the intermediate serial data signal 94 before it is output by an amplifier 98 of the differential output driver circuitry 28.

The serializer circuitry 90, the pre-driver circuitry 26, and the output driver circuitry 28 all draw current from the power 14 provided by the power distribution network (PDN) 16. To compensate for the current drawn to generate the serial data 22B, the compensation circuitry 30 may draw compensating current signals that are at least partly complementary to those drawn by the serializer circuitry 90, the pre-driver circuitry 26, and/or the output driver circuitry 28. Since the pre-driver circuitry 26 may draw the greatest amount of current, in some embodiments, the compensation circuitry 30 may compensate primarily for the current drawn by the pre-driver circuitry 26. In some embodiments, as will be discussed further below, some circuitry may also compensate for other current drawn by the serial RX/TX circuitry (e.g., a serializer).

Additionally, the compensation circuitry 30 may receive the parallel data signal 22A in place of the serialized intermediate data 94. Accordingly, the compensation circuitry 30 may include additional serializer circuitry 90 to serialize compensation parallel data generated by the compensation circuitry 30 prior to drawing the compensating current signals. As described in greater detail below, the compensation circuitry 30 may use feedback loops to determine when the compensating current signals are drawn. When the serial data 22B is transmitted at a high speed and the compensation circuitry 30 receives the serialized intermediate data 94, the timing of the compensation circuitry 30 may be hindered. In contrast, by receiving the parallel data 22A, the compensation circuitry 30 has additional timing budget for feedback loops to operate due to the compensation circuitry 30 operating at a half-rate frequency compared to the compensation circuitry 30 that receives the serialized intermediate data 94. The additional timing budget may be a result of the compensation circuitry 30 operating prior to at least a portion of the serializer circuitry 90.

Figure 6:
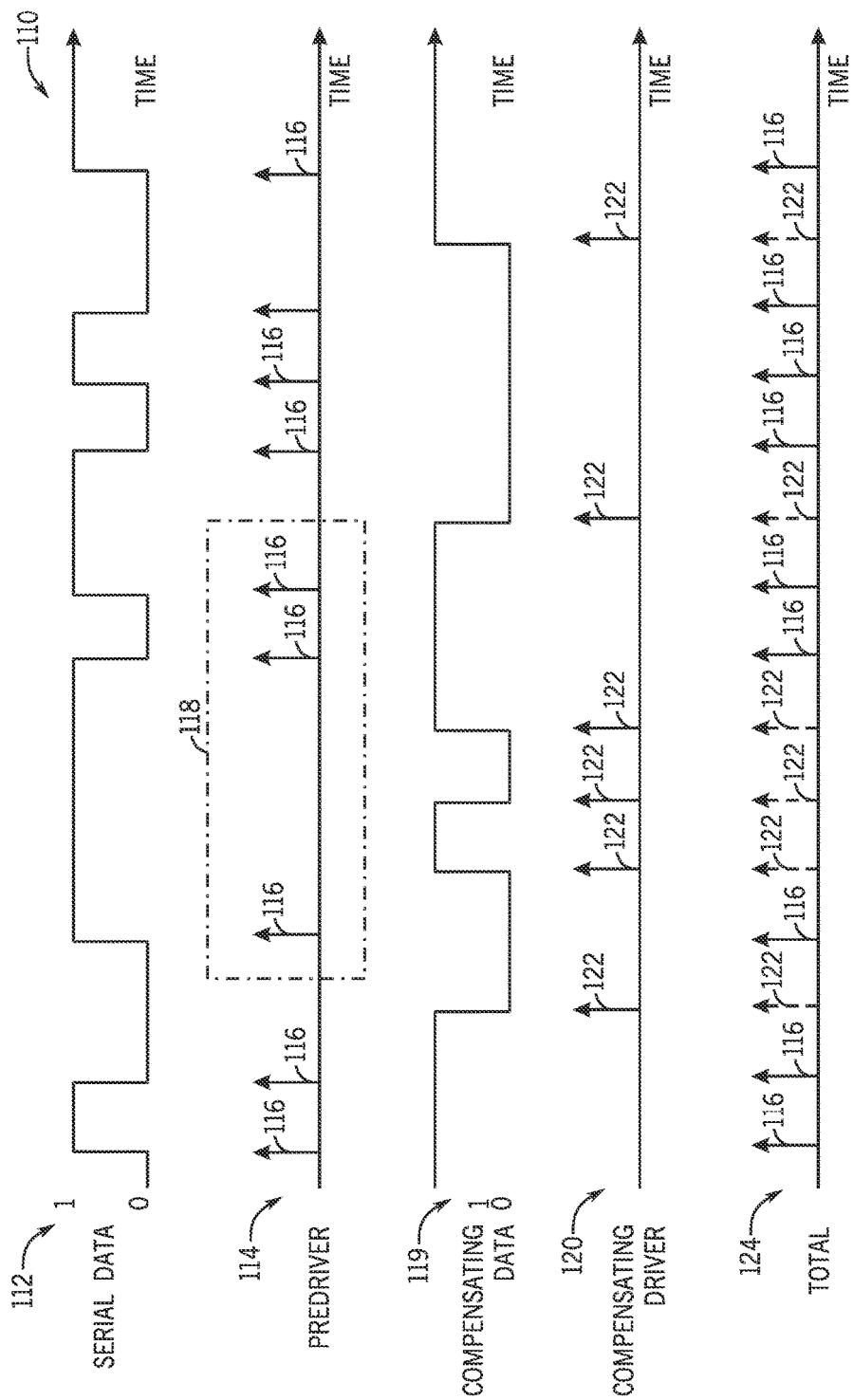
FIG. 6 is a timing diagram of an operation of the compensating driver to increase a frequency of total current drawn from the power distribution network to reduce power supply noise, in accordance with an embodiment.

A timing diagram 110 of FIG. 6 illustrates one manner in which the compensation circuitry 30 may compensate for the current drawn by the pre-driver circuitry 26 by drawing additional current. In the timing diagram 110, a serial data signal 112 is shown to be amplified through the pre-driver circuitry 26. Power usage 114 is current drawn by the pre-driver circuitry 26 to amplify the serial data signal 112. As seen in the power usage 114, the pre-driver circuitry 26 draws current 116 from the power distribution network (PDN) 16 at logical transitions in the serial data signal 112 from low to high or from high to low.

Certain segments 118 of the power usage 114 may have a frequency within the resonant frequency range 54 of the integrated circuit (IC) 10 and/or power distribution network (PDN) 16. Without compensation, the segments 118 could produce power supply noise and jitter. The compensation circuitry 30 thus may increase the frequency of the total current drawn from the power distribution network (PDN) 16 to extend above the resonant frequency range 54. This may reduce the amount of power supply noise and jitter caused by segments such as the segment 118. In the example of FIG. 6, the compensation circuitry 30 may generate a dummy signal 119 having logical transitions that are complementary to the logical transitions of the serial data signal 112. Power usage 120 of the compensation circuitry 30 thus may include current 122 that is substantially complementary to the current 116. Therefore, the total net current 124 may have a frequency beyond the resonant frequency range 54, which may reduce the amount of jitter in the amplified serial data signal 112 due to power-supply-induced noise.

Although the timing diagram 110 of FIG. 6 provides an example in which the compensation circuitry 30 the draws current 122 in a manner that is fully complementary to the current 116, other embodiments may draw current that is only partly complementary. Drawing only a partly complementary current 122 using the compensation circuitry 30 may still reduce the amount of power supply noise and jitter due to the current 116 while consuming less power than drawing a fully complementary current 122.

In a first example of using the compensation circuitry 30 to draw a partly complementary current 122, rather than the fully complementary current 122 illustrated in FIG. 6, the compensation circuitry 30 may generate a different dummy signal 119 having transitions that are only partly complementary to the transitions of the serial data signal 112. Using a dummy signal 119 that is only partly complementary to the serial data signal 112 causes the compensation circuitry 30 to draw less current 122. Even though, in the example of this paragraph, the compensation circuitry 30 may draw less total current 122, the total frequency of a resulting total net current 124 may more often be above the resonant frequency range 54. As such, the amount of power supply noise and jitter may be reduced accordingly. Thus, in at least one embodiment, the compensation circuitry 30 may draw the current 122 at a frequency at least sufficiently complementary to the current 116 to reduce jitter.

In a second example of using the compensation circuitry 30 to draw only a partly complementary current 122, rather than the fully complementary current 122 illustrated in FIG. 6, the compensation circuitry 30 may draw the current 122 at a lower current magnitude than the current 116 drawn by the pre-driver circuitry 26. Even when the current 122 is at a lower magnitude than the current 116, much of the total net current 124 may be greater than the resonant frequency range 54. That is, only the components of the total net current 124 representing the difference between the magnitude of the current 116 and the current 122 may be in the resonant frequency range 54, and this difference may be the source of most remaining jitter. Controlling the difference in magnitudes between the current 116 and the current 122 thus may control the amount of jitter.

Furthermore, the phase of the current 122 may be offset from the phase of the current 116 of the pre-driver circuitry 26 while still reducing power supply noise and, accordingly, jitter. As such, the compensation circuitry 30 may employ components less precise and thus potentially less expensive than those of the pre-driver circuitry 26. Even though the current 122 may be offset in phase from the current 116, more of the total net current 124 may generally exceed the resonant frequency range 54, and thus may reduce jitter due to power supply noise.

Figure 7:
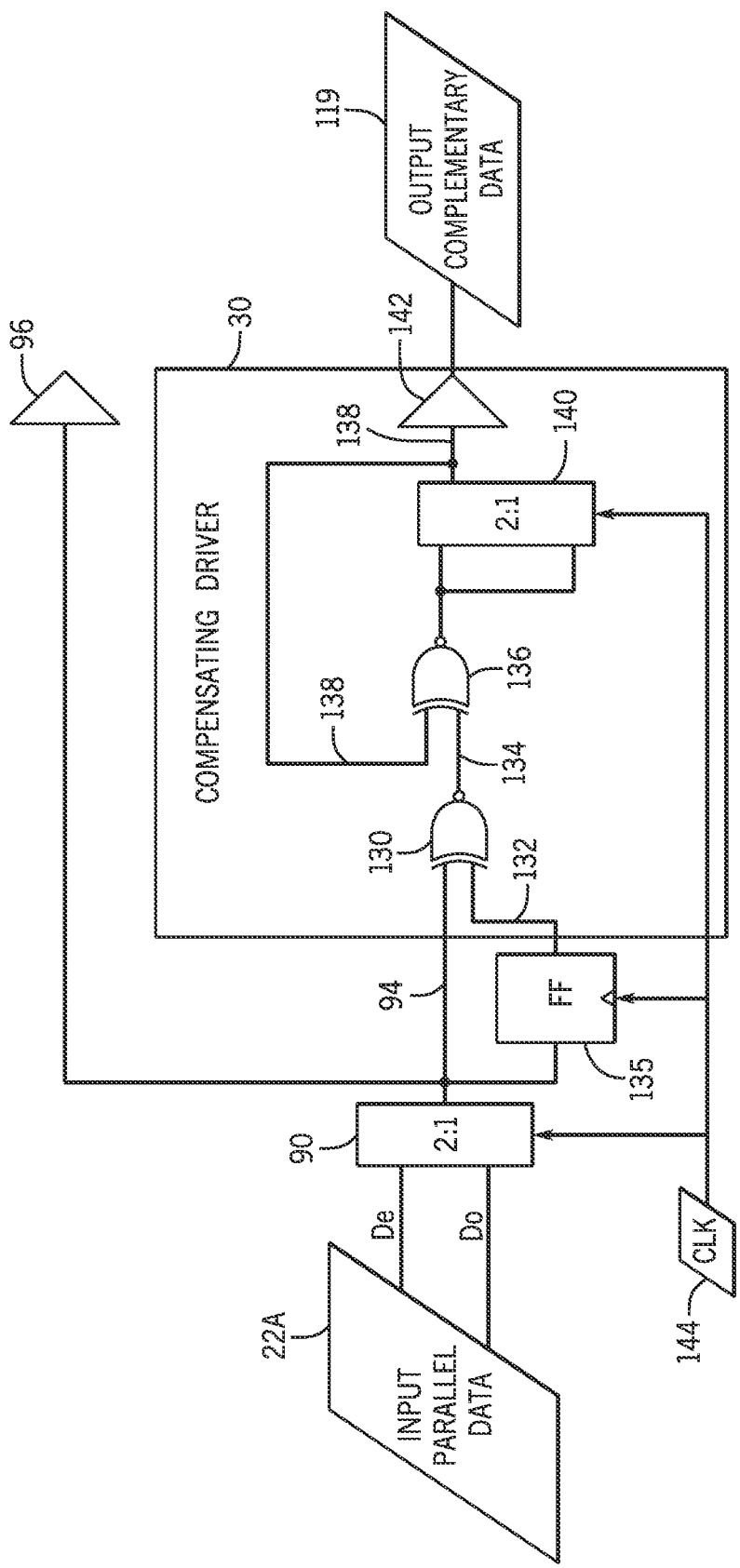
FIG. 7 is a logic diagram illustrating one example of the compensating driver, in accordance with an embodiment.
Figure 8:
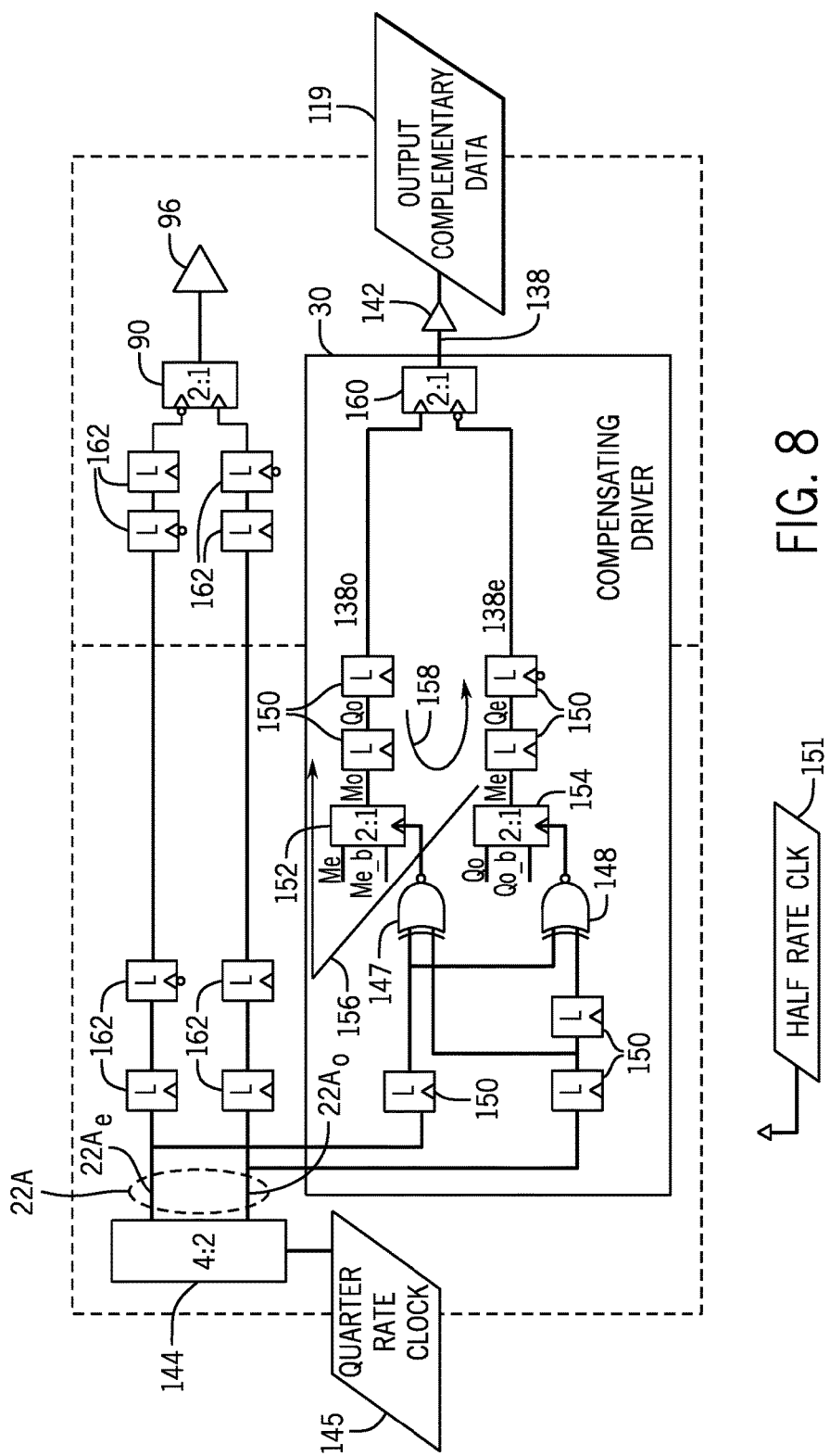
FIG. 8 is a logic diagram illustrating another example of the compensating driver, in accordance with an embodiment.

FIGS. 7 and 8 relate to examples of the compensation circuitry 30. In FIG. 7, the compensation circuitry 30 includes a first XNOR gate 130 (i.e., a comparator) that receives the serial data signal 94 and an immediately previous data signal 132. The first XNOR gate 130 outputs a first output 134 representing a comparison of the serial data signal 94 and the immediately previous data signal 132. Further, the immediately previous data signal 132 may be generated by a buffer 135, which may hold the serial data signal 94 for one clock cycle before outputting the immediately previous data signal 132. Accordingly, the immediately previous data signal 132 represents a data signal transmitted during a clock cycle immediately preceding a clock cycle producing the serial data signal 94. The first output 134 may be a high signal if the serial data signal 94 and the immediately previous data signal 132 are the same (e.g., both are high signals or both are low signals), and the first output 134 may be a low signal if the serial data signal 94 and the immediately previous data signal 132 are not the same (e.g., one is high and the other is low). Thus, the first output 134 provides an indication of whether a logical transition in the serial data 112 has occurred between the immediately previous data signal 132 and the serial data signal 94.

Subsequently, the first output 134 may be supplied to a second XNOR gate 136 of the compensation circuitry 30. The second XNOR gate 136 compares the first output 134 with a second output 138. In comparing the first output 134 with the second output 138, the second XNOR gate 136 may provide a low signal when the serial data signal 94 provides a logic transition (e.g., a high signal transition to a low signal or a low signal transition to a high signal), and the dummy signal 119, as illustrated in FIG. 6, is high. Additionally, the second XNOR gate 136 may provide a low signal when the serial data signal 94 provides a logic transition, and the dummy signal 119 is low. On the other hand, the second XNOR gate 136 may provide a high signal when the serial data signal 94 does not indicate a logic transition, and the dummy signal 119 is high. Further, the second XNOR gate 136 may also provide a high signal when the serial data signal 94 indicates a logic transition, and the dummy signal 119 is low. Accordingly, the dummy signal 119 will provide logic transitions that draw the current 122 illustrated in FIG. 6 when the serial data signal 94 does not provide a logic transition. That is, the dummy signal 119 may draw current 122 that is substantially complementary to the current 116 drawn by the serial data signal 112.

Additionally, the second output 138 is an output of a compensation circuitry 2:1 multiplexer 140. Using the multiplexer 140, the compensation circuitry 30 provides the second output 138, after amplification of the second output 138 via an amplifier 142, as the dummy signal 119 illustrated in FIG. 6. The amplifier 142 may provide amplification to produce a substantially complementary signal to the current drawn by the transmitter circuitry, or the amplifier 142 may provide amplification to produce a signal that is at least partially complementary to the current drawn by the transmitter. Further, because the compensation circuitry 30 operates after the serializer circuitry 90 (e.g., a 2:1 multiplexer), the compensation circuitry 30 operates using a full-rate clock signal 144. Since the compensation circuitry 30 illustrated in FIG. 7 is configured to operate at a full-rate of around 28 GHz, a timing budget to generate each data point of the dummy signal 119 may be around 35 ps.

Because of the timing budget, it may be beneficial to implement the compensation circuitry 30 prior to the serializer circuitry 90 to operate at a half-rate of the full-rate clock signal 144, which may result in essentially doubling the timing budget of the compensation circuitry 30. Accordingly, FIG. 8 illustrates an embodiment of the compensation circuitry 30, which receives the parallel data 22A before the parallel data 22A is serialized by the serializer circuitry 90. Additionally, while FIG. 8 illustrates the compensation circuitry 30 receiving the parallel data 22A after a 4:2 multiplexer 145, which operates using a quarter-rate clock signal 146, it is conceived that the compensation circuitry 30 may also be altered to receive data before the 4:2 multiplexer 145, before an 8:4 multiplexer, before a 16:8 multiplexer, etc. Providing parallel data prior to the multiplexers may progressively increase the timing budget for operation of the compensation circuitry 30. Therefore, as the full-rate clock signal 144 increases for data transmission, the compensation circuitry 30 may move further upstream on a serializing path to increase the timing budget of the compensation circuitry 30.

With this in mind, the compensation circuitry 30 includes an odd XNOR gate 147 and an even XNOR gate 148. The odd XNOR gate 147 receives an even portion 22Ae of the parallel data 22A after storage in a buffer 150 for one half-rate clock cycle, which is provided by a half-rate clock signal 151. The half-rate clock signal 151 may be provided throughout the circuitry and is indicated by an empty triangle symbol (e.g., on the buffers 150 and the serializer circuitry 90). Additionally, the odd XNOR gate 147 receives an odd portion 22Ao of the parallel data 22A after storage in another buffer 150 for one half-rate clock cycle. Further, the even XNOR gate 148 receives the even portion 22Ae of the parallel data 22A after storage in the buffer 150 for a half-rate clock cycle (i.e., the same even portion 22Ae that is received by the odd XNOR gate 147), and the even XNOR gate 148 receives the odd portion 22Ao of the parallel data 22A after the odd portion 22Ao is stored in two buffers, each for one half-rate clock cycle. Using this configuration, the odd XNOR gate 147 compares an even portion 22Ae to a simultaneous odd portion 22Ao to detect potential logic shifts by the serial data signal 94. Additionally, the even XNOR gate 148 compares an even portion 22Ae to an odd portion 22Ao occurring at one half-rate clock cycle later to determine a potential logic shift by the serial data signal 94 from the earlier even portion 22Ae to the subsequent odd portion 22Ao.

After comparisons by the odd XNOR gate 147 and the even XNOR gate 148, outputs of the two gates 146 and 148 operate as clock signals to odd and even 2:1 multiplexers 152 and 154 respectively. Inputs for the odd 2:1 multiplexer 152 include an output Me of the even 2:1 multiplexer 154 and an inverse output Me_b of the even 2:1 multiplexer 154. Additionally, inputs for the even 2:1 multiplexer 154 include an output Qo of a buffer 150 which receives an output Mo from the odd 2:1 multiplexer 152, as well as an inverse output Qo_e of the output Qo. Therefore, the inputs Me, Me_b, Qo, and Qo_b form feedback loops 158 and 156 that ultimately generate an odd portion 138o of the second output 138 and an even portion 138e of the second output 138. The odd portion 138o and the even portion 138e may feed into a final 2:1 multiplexer 160 to form the second output 138. Further, the second output 138 may be fed into an amplifier 142 to generate the dummy signal 119. As discussed above, the dummy signal 119 draws current at logic shifts of the serial data 112 to compensate for instances when the serial data signal 94 does not provide a logic shift and, thus, does not draw current.

Additionally, several buffers 162 may be deposited along a main serialization path of the parallel data 22A between the 4:2 multiplexer 145 and the serializer circuitry 90. The buffers 162 may provide a timing delay for the parallel data 22A prior to the parallel data 22A entering the serializer circuitry 90 for serialization. In using the buffers 162, the main serialization path of the parallel data 22A may output the amplified serial data signal 112 at a time corresponding to timing of the dummy signal 119 generated by the compensation circuitry 30.

It may be appreciated that the compensation circuitry 30 illustrated in FIG. 8 and the compensation circuitry 30 illustrated in FIG. 7 each produce the same dummy signal 119 when the parallel data 22A is the same for both embodiments. Accordingly, the compensation circuitry 30 of FIG. 8 provides enhanced timing accuracy due to a greater timing budget than the compensation circuitry 30 of FIG. 7. Accordingly, the complementary current 122 has a greater likelihood of being drawn at the appropriate time, and the complementary current 122 has a greater likelihood of not missing a lull in the logic shifts of the serial data 112. Further, because of the enhanced timing and accuracy, the jitter experienced by the system may also be reduced based on the current frequency rarely entering the frequency range 54.

Further, any suitable logic capable of generating the dummy signal 119 based on the serial data signal 94 is contemplated. As mentioned above, this logic may include compensation circuitry 30 that receives the parallel data 22A from any point upstream from the serializer circuitry 90. That is, the compensation circuitry 30 may receive the parallel data 22A prior to the parallel data 22A entering the 4:2 multiplexer 145, an 8:4 multiplexer, or any multiplexer earlier in a serialization line. Additionally, it should be emphasized that the logic described by FIGS. 7 and 8 is meant to provide only two examples of the compensation circuitry 30. Any suitable logic that causes current to be drawn in an at least partially complementary manner may be used. For instance, other suitable logic may be used to draw partially complementary current 122 that are of a lower current magnitude, have a phase offset, and/or are fewer in number.

Figure 9:
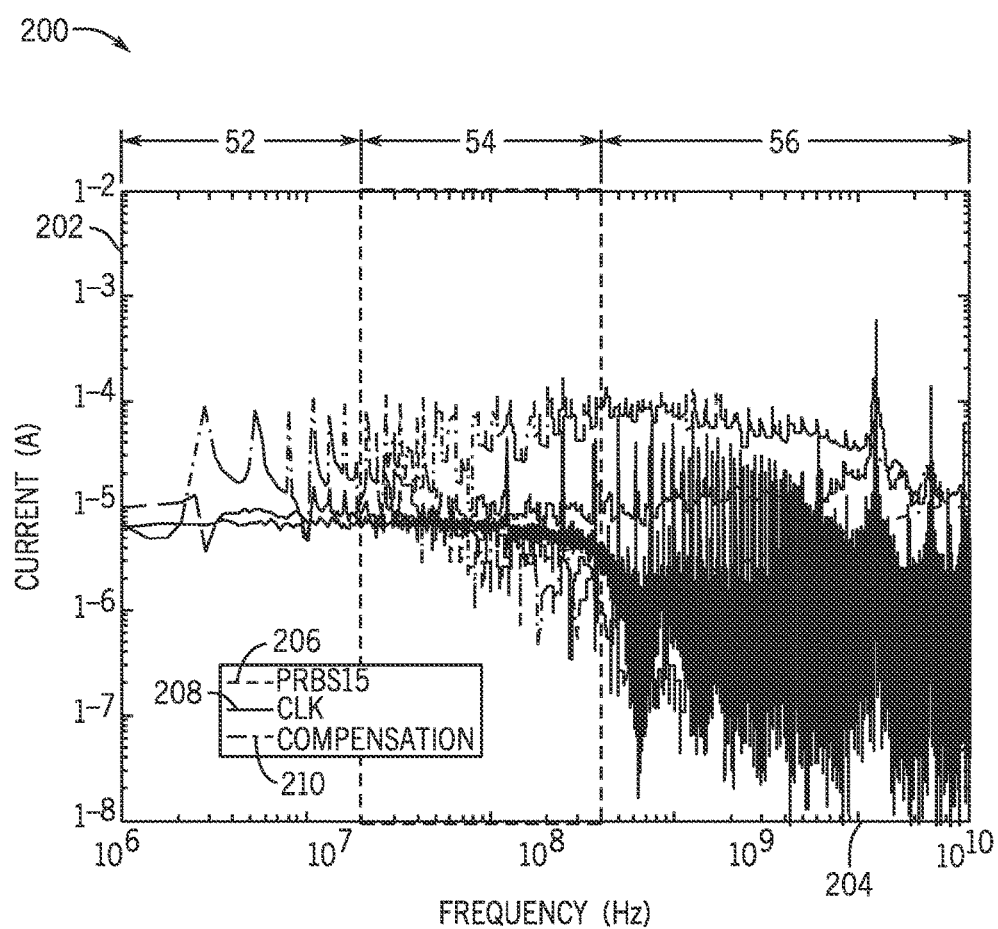
FIG. 9 is a plot illustrating simulated results obtained from using the compensating driver of FIG. 5 with different pseudorandom binary sequence (PRBS) data signals, in accordance with an embodiment.
Figure 10:
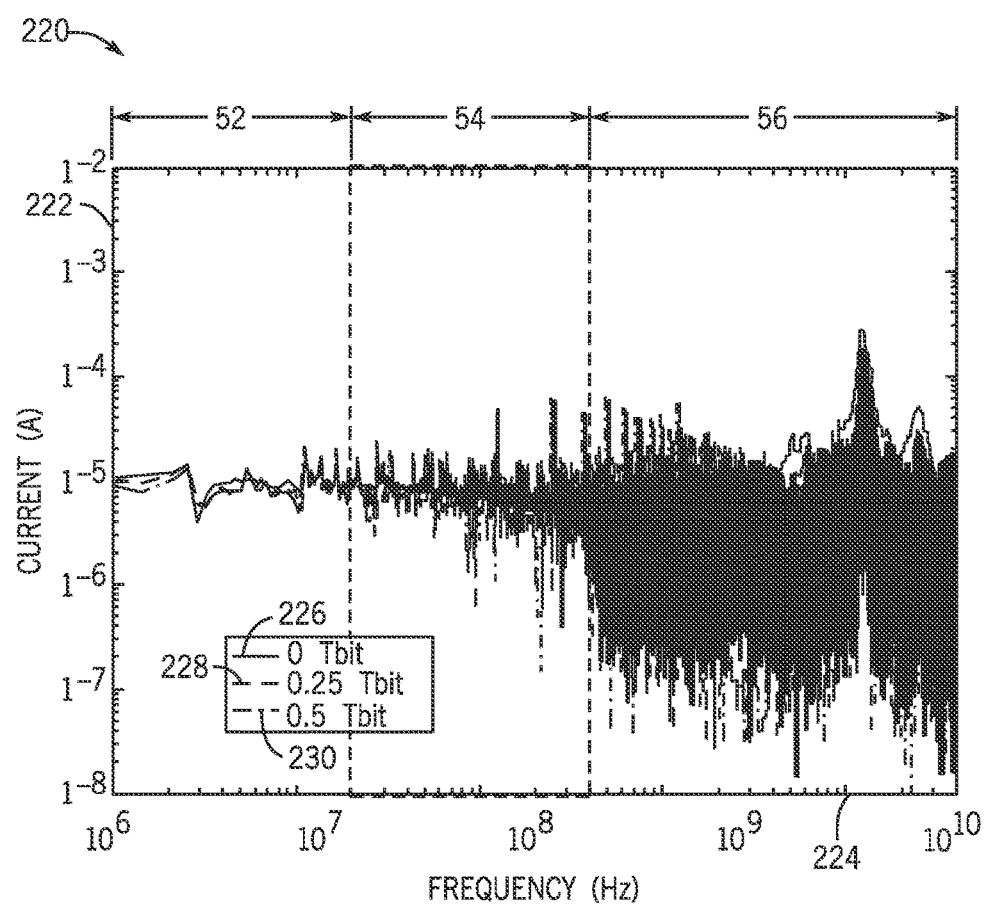
FIG. 10 is a plot illustrating simulated results obtained from using the compensating driver of FIG. 5 with different data transmission rates, in accordance with an embodiment.

FIGS. 9 and 10 are plots of simulation results involving the compensation circuitry 30. In particular, a plot 200 of FIG. 9 illustrates a simulated effect of current (ordinate 202) in relation to frequency (abscissa 204) when compensation circuitry 30 is used to add to the frequency of total current drawn. In the example of FIG. 9, PRBS15 data of 32 Gbps is simulated to be transmitted. A dashed line 206 represents current drawn by the pre-driver circuitry 26 to amplify a PRBS15 data signal, a solid line 208 represents a clock signal, and a dashed-dotted line 210 represents a total amount of current drawn by both transmitter circuitry and the compensation circuitry 30. Although the pre-driver circuitry 26 draws a significant amount of current in the resonant frequency range 54 to amplify the PRBS15 data (dashed line 206), the sum of the current drawn by the pre-driver circuitry 26 and the compensation circuitry 30 (dashed-dotted line 210) totals mostly higher than the resonant frequency range 54, occurring primarily in the frequency range 56. Thus, while the current due to amplifying the PRBS15 data (dashed line 206) occurs substantially in the range of 10-400 MHz, the components of the total current (dashed-dotted line 210) in the resonant frequency range 54 are substantially reduced, even though they may be increased in the higher frequency range 56 beyond the resonant frequency range 54.

A plot 220 of FIG. 10 illustrates simulated total current drawn (ordinate 222) in relation to frequency (abscissa 224) for data at varying bit times for a particular data rate. In the plot 220 of FIG. 15, a solid line 226 illustrates current drawn for a 1-Tbit (bit time), a dashed line 228 illustrates current drawn for a 0.25-Tbit (bit time), and a dashed-dotted line 230 illustrates current drawn for a 0.5-Tbit (bit time). In all cases, it can be seen that the total current may be substantially beyond the resonant frequency range 54. Thus, the compensation circuitry 30 may reduce jitter even under these conditions, where there is a different skew between the transmitter data path and the compensation circuitry 30 path. That is, the small skew of the different bit times may not substantially impact performance.

The disclosure provided above is intended to provide various specific examples in which compensating circuitry may reduce power-supply-noise-induced jitter by increasing the frequency of total current drawn. Although the compensating circuitry of this disclosure has been described in relation to compensating currents drawn by a serializer circuitry, pre-driver circuitry, and/or output driver circuitry of a serial transmitter, it should be appreciated that the current compensation discussed above may be used to compensate for current drawn by any other circuitry used in an integrated circuit (IC). In such cases, compensation circuitry may draw additional current that are at least partially complementary to the current drawn by the other circuitry to cause the total current to be higher than a resonant frequency range of the IC and/or power distribution network (PDN) of the IC. By drawing additional, at least partly complementary current, jitter due to power supply noise may be reduced without substantially increasing the amount of on-die capacitance (ODC), even as data transfer rates increase.

Moreover, although the scheme presented above is explained using unidirectional I/O, it may be equally applied to bidirectional I/O such as various DDR interface types. Indeed, the same or similar techniques may be used in output drivers in addition to the predrivers discussed above.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims. Moreover, means-plus-function or step-plus-function construction is not intended unless a claim recites "means for" or "step for" followed by a function. Recitations such as "configured to" are intended to define the operation of claim elements without invoking means-plus-function or step-plus-function construction.

What is claimed is:

1. An integrated circuit device comprising:
   a power distribution network to supply power to components of the integrated circuit device;
   a parallel data input path that provides a parallel data signal;
   serializer circuitry configured to receive the parallel data signal from the parallel data input path and generate a serialized data signal based on the parallel data signal;
   data driver circuitry to draw first current from the power distribution network to drive the serialized data signal; and
   compensation circuitry configured to receive the parallel data signal from the parallel data input path and to draw second current from the power distribution network at times when the data driver circuitry is not drawing the first current, thereby causing a net of the first and second current to be outside a resonant frequency range of at least one of the integrated circuit device or a component of the integrated circuit device, wherein the compensation circuitry receives the parallel data signal and draws the second current from the power distribution network based on the parallel data signal.

2. The integrated circuit device of claim 1, wherein the data driver circuitry draws the first current at frequencies substantially within the resonant frequency range of the integrated circuit device or a component of the integrated circuit device, or both.

3. The integrated circuit device of claim 1, wherein the data driver circuitry draws the first current at frequencies of between approximately 10-400 Mhz.

4. The integrated circuit device of claim 1, wherein the net of the first and second current has a clocklike current pattern.

5. The integrated circuit device of claim 1, wherein the data driver circuitry comprises a predriver of a serial data transmitter, an output driver of the serial data transmitter, or any combination thereof.

6. The integrated circuit device of claim 1, wherein the data driver circuitry comprises a unidirectional component of data utilization circuitry of the integrated circuit device, a bidirectional component of the data utilization circuitry of the integrated circuit device, or a combination thereof.

7. The integrated circuit device of claim 1, wherein the parallel data signal comprises two or more bits of data transmitted in parallel.

8. An integrated circuit device comprising:
   a power distribution network;
   a parallel data input path that provides a parallel data signal;
   serializer circuitry to convert the parallel data signal received from the parallel data input path into a first serial data signal using first current drawn from the power distribution network;
   predriver circuitry to amplify the first serial signal into an amplified serial data signal using second current drawn from the power distribution network;
   output driver circuitry to output the amplified serial data signal using third current drawn from the power distribution network; and
   compensation circuitry to receive the parallel data signal from the parallel data input path and draw complementary current from the power distribution network that is at least partially complementary to the first current, the second current, the third current, or any combination thereof.

9. The integrated circuit device of claim 8, wherein:
   the serializer circuitry comprises a 2:1 multiplexer configured to draw the first current in a magnitude that varies depending on a number of signal transitions from high to low and low to high facilitated by the 2:1 multiplexer; and
   the compensation circuitry comprises serializer compensation circuitry comprising one or more 2:1 multiplexers and one or more comparators configured to draw the complementary current based on the parallel data signal, wherein the complementary current comprises a fourth current from the power distribution network that has a magnitude complementary to the magnitude of the first current, wherein a total current drawn by a sum of the first and fourth currents remains substantially the same over time.

10. The integrated circuit device of claim 9, wherein the one or more comparators comprise XNOR logic gates.

11. The integrated circuit device of claim 8, wherein the compensation circuitry comprises buffers, comparators, and multiplexers, and the compensation circuitry uses a half-rate clock signal for operation of the buffers, the comparators, and the multiplexers when compared to a full-rate clock signal of the output driver circuitry.

12. The integrated circuit device of claim 8, wherein the compensation circuitry comprises:
   a first XNOR gate configured to generate a first output comparison based on receiving an even portion of the parallel data signal and an odd portion of the parallel data signal;
   a second XNOR gate configured to generate a second output comparison based on receiving an even portion of the parallel data signal and a subsequent odd portion of the parallel data signal;
   a first multiplexer, a second multiplexer, and a third multiplexer, wherein:
      the first multiplexer is configured to receive the first output comparison, an output of the second multiplexer, and an inverse of the output of the second multiplexer;
      the second multiplexer is configured to receive the second output comparison, a delayed output of the first multiplexer, and an inverse of the delayed output of the first multiplexer; and
      the third multiplexer is configured to receive the output of the first multiplexer and the output of the second multiplexer and generate a second serial data signal complementary to the first serial data signal.

13. An integrated circuit device, comprising:
   a power distribution network;
   a parallel data input path that provides a first signal, wherein the first signal is a parallel data signal;
   serializer circuitry configured to receive the first signal from the parallel data input path and to convert the first signal into a second signal using a first current drawn from the power distribution network within a resonant frequency range of the integrated circuit device or a component of the integrated circuit device;
   compensation circuitry configured to receive the first signal disposed within the integrated circuit device from the parallel data input path and to generate a third signal to draw a second current from the power distribution network at times when the first current is not being drawn;
   wherein a sum of the first and second current has a reduced component of current within the resonant frequency range as compared to the first current alone.

14. The integrated circuit of claim 13, wherein the first signal comprises parallel data signal, the second signal comprises a serial data signal, and the third signal comprises an amplified serial signal.

15. The integrated circuit of claim 13, wherein the second current is at least partially complementary to the first current.

16. The integrated circuit of claim 13, wherein the second current has a magnitude complementary to the magnitude of the first current.

17. The integrated circuit of claim 13, comprising output driver circuitry configured to output serial data from the the second signal.

18. The integrated circuit of claim 13, wherein the first signal comprises at least two bits of data transmitted in parallel.

19. The integrated circuit of claim 13, wherein a total current drawn by the sum of the first and second currents remains substantially the same over time.

* * * * *